United States Patent [19]

Yoder

[11] Patent Number: 4,671,845
[45] Date of Patent: Jun. 9, 1987

[54] METHOD FOR PRODUCING HIGH QUALITY GERMANIUM-GERMANIUM NITRIDE INTERFACES FOR GERMANIUM SEMICONDUCTORS AND DEVICE PRODUCED THEREBY

[75] Inventor: Max N. Yoder, Falls Church, Va.

[73] Assignee: The United States of America as represented by the Secretary of the Navy, Washington, D.C.

[21] Appl. No.: 714,779

[22] Filed: Mar. 22, 1985

[51] Int. Cl.$^4$ .................. C30B 31/22; H01L 21/24; C23C 14/00

[52] U.S. Cl. .................. 156/610; 148/183; 148/DIG. 3; 148/DIG. 24; 148/DIG. 45; 148/DIG. 83; 204/192.31; 204/180.2; 427/38; 428/698

[58] Field of Search ......... 427/38; 148/6,6.3, DIG. 3, 148/DIG. 24, DIG. 45, DIG. 83, DIG. 81; 204/180.7, 180.2; 428/698; 156/610, DIG. 73, DIG. 66, DIG. 67

[56] References Cited

U.S. PATENT DOCUMENTS

| | | | |
|---|---|---|---|
| 3,226,194 | 12/1965 | Kuntz | 23/191 |
| 3,922,475 | 11/1975 | Manasevit | 428/539 |
| 4,000,020 | 12/1976 | Gaitman | 156/610 |
| 4,105,805 | 8/1978 | Glendinning et al. | 427/38 |
| 4,144,116 | 3/1979 | Jacob et al. | 156/611 |
| 4,333,808 | 6/1982 | Bhattacharyya et al. | 427/38 |
| 4,448,633 | 5/1984 | Shuskus | 156/610 |
| 4,510,172 | 4/1985 | Ray | 427/38 |
| 4,522,886 | 6/1985 | Chin et al. | 427/94 |

OTHER PUBLICATIONS

Yagi et al, Japanese Jl of Applied Physics, vol. 16, No. 2, 2/77, pp. 245–251.
Tarvi et al., Jl of Electrochemical Society, 11/63, pp. 1167–1169.

*Primary Examiner*—Gary P. Straub
*Attorney, Agent, or Firm*—Kenneth E. Walden; Frederick A. Wein-

[57] ABSTRACT

The present invention relates to the production of a stable insulator of a germanium and a device produced thereby. A germanium substrate is provided with a layer of silicon nitride deposited on one of the outer surfaces. Ionized nitrogen is implanted by an ion beam into the silicon nitride layer. An electric field is applied across the substrate and layer. In one embodiment the substrate and layer are annealed while maintaining the electric field, the electric field is removed, and a second annealing step grows the germanium nitride insulator layer subcutaneously. In another embodiment the subcutaneous germanium nitride insulator layer is grown during a single annealing step by continued application of the electric field to the substrate and the layer.

6 Claims, 2 Drawing Figures

METHOD FOR PRODUCING HIGH QUALITY GERMANIUM-GERMANIUM NITRIDE INTERFACES FOR GERMANIUM SEMICONDUCTORS AND DEVICE PRODUCED THEREBY

BACKGROUND OF THE INVENTION

The present invention relates to germanium semiconductor technology, and more particularly to a high quality germanium-germanium nitride interface without adverse oxygen incorporation.

The principal reason for the early demise of germanium transitor technology was the lack of a stable non-hygroscopic native insulator and the competing availability of such an insulator for silicon. Subsequent to the general replacement of germanium by silicon, several advances have been shown to provide a stable insulator for germanium.

One such advance is of a subcutaneously grown germanium dioxide insulator using a deposited silicon dioxide overlayer through which oxygen is admitted at high temperature. This work was reported by V. M. Zabotin as "Effect of a $GeO_2$ System" published in Mikroelektronika, Vol. 6, No. 4, pp 359-364 July-August 1977. Although duplicated by others in the U.S., interface state charge densities are not as low as those of the $Si/SiO_2$ interface and the stability of such an insulator layer is questionable.

J. Rosenberg and E. S. Yang of Columbia University have used a conventional thermal nitridation process to grow a germanium nitride insulator on germanium and to demonstrate a remarkable surface electron mobility of 1900 $cm^2$ volt-second. This process, however, admits too much oxygen and resulted in insulators of too low resistivity to be practical. The ammonia used to grow the germanium nitride acts as an etchant which must be inhibited by a brief oxide growth. The oxide, in turn, must be later pyrolized after a sufficient $Ge_3N_4$ overgrowth occurs. This procedure does not lead to reproducibility.

Accordingly it is desirable to provide a stable insulator for germanium.

OBJECTS OF THE INVENTION

Accordingly, it is an object of the present invention to provide a stable insulator for germanium semiconductors.

Another object of the present invention is to provide an insulator for germanium which is stable and non-hygroscopic.

Still another object of the present invention is to provide a subcutaneous germanium nitride insulator for germanium.

Further objects and advantages of the present invention will become apparent as the following description proceeds and features of novelty and characterizing the invention will be pointed out in particularity in the claims annexed to and forming a part of this specification.

SUMMARY OF THE INVENTION

Briefly, the present invention relates to the production of a stable insulator for germanium and a device produced thereby. A germanium substrate is provided with a layer of silicon nitride deposited on one of the outer surfaces. Ionized nitrogen is implanted by an ion beam into the silicon nitride layer. An electric field is applied across the substrate and layer. In one embodiment of the present invention, the substrate and layer are annealed while maintaining the electric field, the electric field is removed, and a second annealing step grows the germanium nitride subcutaneously of the silicon nitride layer. In another embodiment of the present invention, the subcutaneous germanium nitride insulator layer is grown with one annealing step by continued application of the electric field to the substrate and the layer.

DESCRIPTION OF THE DRAWINGS

For a better understanding of the present invention reference may be had to the accompanying drawings wherein.

DETAILED DESCRIPTION OF THE PREFERRED EMBODIMENT

Figure 1:
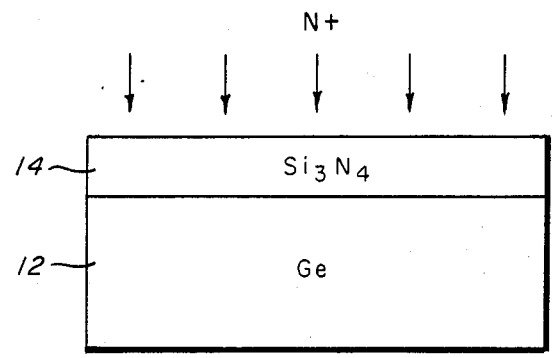
FIG. 1 shows a representation of a germanium substrate and a silicon nitride encapsulant with nitrogen ions being implanted.
Figure 2:
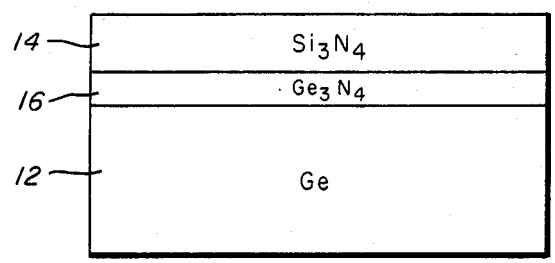
FIG. 2 shows the germanium substrate and silicon nitride encapsulant having a subcutaneously grown germanium dioxide insulator at the layer interfaces of FIG. 1.

The present invention avoids oxygen contamination of the germanium nitride ($Ge_3N_4$) and/or the $Ge_3N_4/Ge$ interface. Referring now to the drawings wherein like reference numerals have been applied to like members there is shown in FIGS. 1 and 2 where nitrogen ions are implanted into the germanium 12 through a previously deposited silicon nitride ($Si_3N_4$) encapsulant 14.

The $Si_3N_4$ cap 14 is first deposited to a thickness of 200–600 angstroms using a conventional plasma deposition technique. Singly ionized nitrogen is then implanted using a 100 kV beam to a fluence of $5 \times 10^{17}$ ions/$cm^2$. This is then followed by a $1 \times 10^{17}$ fluence at 50 kV.

The $Si_3N_4$ top surface and the substrate bottom are then metallized by evaporating or sputtering a refractory metal such as platinum, tungsten, or palladium.

An electric field is applied across the metalized contacts such that the field strength across the $Si_3N_4$ is about 3 kV/cm. The upper $Si_3N_4$ contact is negative and the substrate contact is positive. The device is then annealled at 350° C. for 30 minutes to (1) pyrolize any GeO and (2) getter all nitrogen ions to the vicinity of the $Ge/Si_3N_4$ interface. The electric field bias is then removed and the structure is then annealled for 30 minutes at 640° C. to grow the subcutaneous $Ge_3N_4$ insulating film 16.

In the alternate embodiment, the application of an electric field can be used to provide an underlying deep buried insulating layer of $Ge_3N_4$ without the second annealing process. For this embodiment, the fluence must be increased to $10^{18}$/$cm^2$ using a single-energy beam of 380,000 volts.

The $Si_3N_4$ encapsulant and the metallization may singly or both be removed either in their entireties or in part depending upon the ultimate use. Either wet acid or reactive ion etching may be used for such removal.

Thus the disclosed method provides means of fabricating a $Ge/Ge_3N_4$ interface without adverse oxygen incorporation. It is useful for (1) providing a stable surface passivation of germanium in a manner not affected by humidity, (2) providing a native insulator on germanium not affected by polytypism, and (3) providing an insulator on germanium which has a very low surface state density thus permitting the germanium surface to be either inverted or accumulated of charge carriers.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. A method of producing a germanium semiconductor device comprising the steps of: providing a germanium (Ge) substrate having a layer of silicon nitride ($Si_3N_4$) deposited onto one of the outer surfaces,
   implanting nitrogen ions into the silicon nitride layer,
   applying an electric field across the substrate and the layer, the layer being applied a negative polarity, the substrate being applied a positive polarity,
   first annealing of the substrate and the layer while maintaining the electric field, said annealing and said electric feed in combination causing the pyrolysis of any GeO and gettering the nitrogen ions to the vicinity of the $Ge/Si_3N_4$ interface,
   removing of the electric field, and
   second annealing of the device at temperatures sufficient for growing a subcutaneous $Ge_3N_4$ film at the $Ge/Si_3N_4$ interface.

2. The method of claim 1 further comprising the step of removal of at least a portion of the silicon nitride layer.

3. A method of producing a germanium semiconductor comprising the steps of:
   providing a germanium (Ge) substrate having a layer of silicon nitride ($Si_3N_4$) deposited onto one of the outer surfaces,
   implanting nitrogen ions onto the silicon nitride layer,
   applying an electric field across the substrate and the layer, the layer being applied a negative polarity, the substrate being applied a positive polarity, and
   annealing the substrate and layer at a sufficient temperature while maintaining the electric field to grow a subcutaneous $Ge_3N_4$ film at the $Ge/Si_3N_4$ interface.

4. The method of claim 3 further comprising the step of removal of at least a portion of the silicon nitride layer.

5. A method for producing a germanium semiconductor device comprising the steps of:
   providing a germanium substrate having a layer of an encapsulant disposed on an outer surface of the substrate, and
   subcutaneously producing a layer of $Ge_3N_4$ insulator onto the outer surface of the substrate through the encapsulant by nitrogen ion beam implantation, application of an electric field, and annealing of the substrate and the layer for a sufficient time and at a sufficient temperature to pyrolize any GeO and while maintaining said electric field to getter all nitrogen ions into the vicinity of the outer surface of the substrate.

6. The method of claim 5 wherein the encapsulant is silicon nitride.

* * * * *